(12) United States Patent
Tsai

(10) Patent No.: US 10,631,388 B2
(45) Date of Patent: Apr. 21, 2020

(54) POWER SUPPLY DEVICE

(71) Applicant: Cosmo Lighting Inc., Walnut, CA (US)

(72) Inventor: Nai-Chen Tsai, New Taipei (TW)

(73) Assignee: COSMO LIGHTING INC., Walnut, CA (US)

( * ) Notice: Subject to any disclaimer, the term of this patent is extended or adjusted under 35 U.S.C. 154(b) by 0 days.

(21) Appl. No.: 16/143,990

(22) Filed: Sep. 27, 2018

(65) Prior Publication Data

US 2019/0103592 A1 Apr. 4, 2019

Related U.S. Application Data

(60) Provisional application No. 62/565,327, filed on Sep. 29, 2017, provisional application No. 62/584,619, filed on Nov. 10, 2017.

(51) Int. Cl.
*H01M 2/10* (2006.01)
*H02J 7/00* (2006.01)
(Continued)

(52) U.S. Cl.
CPC ............. *H05B 45/48* (2020.01); *B29C 33/12* (2013.01); *B29C 33/42* (2013.01); *B29C 39/10* (2013.01);
(Continued)

(58) Field of Classification Search
CPC ............. H05B 33/083; H05B 33/0845; H05B 33/0806; B29C 39/10; B29C 33/12; B29C 33/42; H02J 7/0081; H01L 21/67259; H01L 33/00; H01L 25/13; H01L 25/0753; H01L 33/52; H01L 33/62; H01L 21/67144; H01L 2933/0033; H01L 2933/0066; H01L 2933/005; G06F 1/26; F21S 4/26; F21S 4/10; F21V 19/0025; F21V 23/001; F21V 19/001; F21V 17/04; H02G 1/1256; B65H 54/14; H01M 2/1016; B29L 2031/747; F21Y 2103/10; F21Y 2115/10

See application file for complete search history.

(56) References Cited

U.S. PATENT DOCUMENTS

| | | | |
|---|---|---|---|
| 2010/0271813 A1* | 10/2010 | Peterson | F21L 4/027 362/183 |
| 2014/0265604 A1* | 9/2014 | Mergener | H02J 7/0063 307/80 |
| 2016/0056656 A1* | 2/2016 | Jonely | H02J 7/0063 320/126 |

* cited by examiner

*Primary Examiner* — Lisa S Park
(74) *Attorney, Agent, or Firm* — Li & Cai Intellectual Property (USA) Office

(57) ABSTRACT

A power supply device is provided, which includes a plurality of battery packs and a plurality of unidirectional conductive elements. The plurality of battery packs are connected in parallel with each other and disposed toward the same direction. The unidirectional conductive elements are connected in serial to the battery packs, respectively. A positive pin of each of the unidirectional conductive elements is connected in serial to a positive terminal of the corresponding battery pack, and a negative pin of each of the unidirectional conductive elements is connected in parallel to negative pins of other unidirectional conductive elements. Therefore, the present disclosure is capable of preventing the battery packs having relatively lower voltages from being charged by the battery packs having relatively higher voltages, thereby prolonging lifetimes of batteries, and avoid from affecting power to be supplied to a power receiving circuit from the battery packs.

11 Claims, 10 Drawing Sheets

(51) Int. Cl.
*G06F 1/26* (2006.01)
*H05B 45/48* (2020.01)
*B29C 39/10* (2006.01)
*B29C 33/12* (2006.01)
*F21K 9/90* (2016.01)
*H05B 45/00* (2020.01)
*H05B 45/10* (2020.01)
*H05B 45/40* (2020.01)
*F21S 4/10* (2016.01)
*B29C 33/42* (2006.01)
*F21V 17/04* (2006.01)
*F21V 19/00* (2006.01)
*F21V 23/00* (2015.01)
*F21S 4/26* (2016.01)
*B65H 54/14* (2006.01)
*H01L 21/67* (2006.01)
*H01L 25/075* (2006.01)
*H01L 33/52* (2010.01)
*H01L 33/62* (2010.01)
*H01L 25/13* (2006.01)
*H01L 33/00* (2010.01)
*H02G 1/12* (2006.01)
*F21Y 115/10* (2016.01)
*B29L 31/00* (2006.01)
*F21Y 103/10* (2016.01)

(52) U.S. Cl.
CPC ............... *B65H 54/14* (2013.01); *F21K 9/90* (2013.01); *F21S 4/10* (2016.01); *F21S 4/26* (2016.01); *F21V 17/04* (2013.01); *F21V 19/001* (2013.01); *F21V 19/0025* (2013.01); *F21V 23/001* (2013.01); *G06F 1/26* (2013.01); *H01L 21/67144* (2013.01); *H01L 21/67259* (2013.01); *H01L 25/0753* (2013.01); *H01L 25/13* (2013.01); *H01L 33/00* (2013.01); *H01L 33/52* (2013.01); *H01L 33/62* (2013.01); *H01M 2/1016* (2013.01); *H02G 1/1256* (2013.01); *H02J 7/007184* (2020.01); *H05B 45/00* (2020.01); *H05B 45/10* (2020.01); *H05B 45/40* (2020.01); *B29L 2031/747* (2013.01); *F21Y 2103/10* (2016.08); *F21Y 2115/10* (2016.08); *H01L 2933/005* (2013.01); *H01L 2933/0033* (2013.01); *H01L 2933/0066* (2013.01)

POWER SUPPLY DEVICE

CROSS-REFERENCE TO RELATED PATENT APPLICATION

This application claims priority from the U.S. Provisional Patent Application Ser. No. 62/565,327 filed Sep. 29, 2017 and the U.S. Provisional Patent Application Ser. No. 62/584,619 filed Nov. 10, 2017, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power supply device, and more particularly to a power supply device capable of preventing one or more battery packs from charging other battery packs connected in parallel to the one or more battery packs.

BACKGROUND OF THE DISCLOSURE

With the rapid development of electronic technologies, middle-sized battery packs or large-sized battery packs are more widely used. The battery packs must perform charging and discharging operations multiple times during processes of manufacturing, testing and using the battery packs. The conventional charging or discharging devices still have many disadvantages. For example, they must include the same model of the battery packs connected in parallel to each other so that the battery packs have the same voltage. If different types of the battery packs having different voltages are connected in parallel to each other, the battery packs having relatively higher capacitances may charge or discharge the battery packs having relatively lower capacitances. As a result, the battery packs having the relatively lower capacitances may be damaged such that their lifetimes are reduced.

SUMMARY OF THE DISCLOSURE

In response to the above-referenced technical inadequacies, the present disclosure provides a power supply device which can be easily operated and is highly reliable in solving the problem of the battery packs charging and discharging to each other.

The present disclosure includes a plurality of first battery packs and a plurality of first low unidirectional conductive elements. The first battery packs have the same or different rated voltages from each other. The first battery packs are connected in parallel with each other and disposed toward the same direction. The first low unidirectional conductive elements are respectively connected in series to some of the first battery packs that have relatively lower rated voltages. The first low unidirectional conductive elements are connected in parallel with each other and disposed toward the same direction.

As described above, the present disclosure provides the power supply device, wherein all of the battery packs or some of the battery packs that have the relatively lower voltages are respectively connected in series to the unidirectional conductive elements such as the light-emitting diodes that have unidirectional conductive characteristics, respectively. Therefore, the present disclosure is capable of effectively preventing one or more battery packs from charging other battery packs connected in parallel to the one or more battery packs, thereby avoiding the battery packs from being damaged, overheating, leaking, or even exploding.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
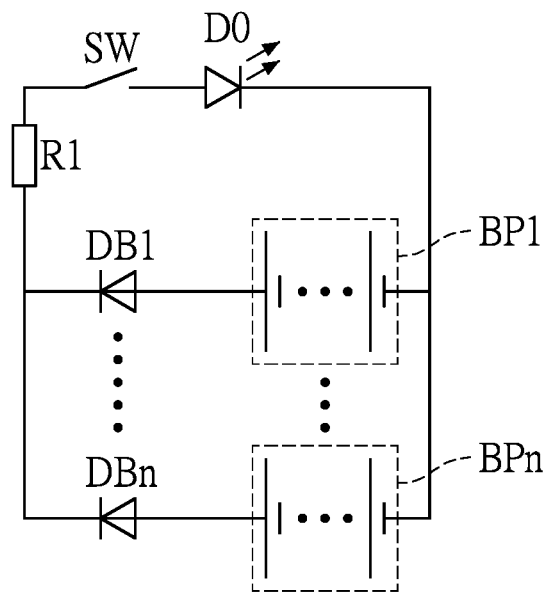
FIG. 1 is a circuit layout diagram of a power supply device according to a first embodiment of the present disclosure, where positive terminals of battery packs each having batteries are respectively connected in series to positive pins of unidirectional conductive elements and the series circuits thus formed are connected in parallel with each other.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a circuit layout diagram of a power supply device according to a first embodiment of the present disclosure, where positive terminals of battery packs each having batteries are respectively connected in series to positive pins of unidirectional conductive elements and the series circuits thus formed are connected in parallel with each other. As shown in FIG. 1, the power supply device includes a plurality of battery packs BP1~BPn and a plurality of unidirectional conductive elements DB1~DBn, wherein n may be any positive integer larger than 1.

In the embodiment, each of the battery packs BP1 to BPn may include a plurality of batteries. Alternatively, each of the battery packs BP1 to BPn may have only a single battery. The battery packs BP1 to BPn may have different numbers of batteries from each other. The batteries of the same battery packs BP1 to BPn are connected in series to each other and disposed toward the same direction. That is, a positive terminal of each of the batteries is connected to a negative terminal of the adjacent battery. The batteries of the different battery packs BP1 to BPn are connected in parallel to each other and disposed toward the same direction. That is, the positive terminals of all of the batteries face a direction in which the unidirectional conductive elements DB1 to DBn connected in series to the batteries are disposed.

It should be noted that the unidirectional conductive elements DB1 to DBn are respectively connected in series to the battery packs BP1 to BPn, wherein the unidirectional conductive element DB1 is connected in series to the battery pack BP1, and the unidirectional conductive element DBn is connected in series to the battery pack BPn. In the embodiment, the unidirectional conductive elements DB1~DBn are light-emitting diodes which are, for example, made of silicon or germanium, but the present disclosure is not limited thereto. Each of the unidirectional conductive elements DB1~DBn may have a positive pin and a negative pin. The positive pins of the unidirectional conductive elements DB1~DBn are respectively connected in series to the positive terminals of the battery packs BP1~BPn. The negative pins of the unidirectional conductive elements DB1~DBn are connected in parallel with each other. In other words, the unidirectional conductive elements DB1~DBn are connected in parallel with each other and disposed toward the same direction.

In the embodiment, each of the battery packs BP1~BPn is connected in series to only one of the unidirectional conductive elements DB1~DBn. That is, the number of the battery packs BP1~BPn is as same as the number of the unidirectional conductive elements DB1~DBn. However, in practice, for example, in order to more effectively prevent the battery packs from charging other battery packs, the number of the unidirectional conductive element connected to each of the battery packs DB1 to DBn may be increased according to the actual requirement.

The battery packs (non-rechargeable battery packs) may include different brands and models of new and old batteries, and thus the battery packs DB1 to DBn may have different voltages. Therefore, in the embodiment, the unidirectional conductive elements DB1 to DBn are respectively connected to the battery packs BP1 to BPn. The unidirectional conductive elements DB1 to DBn having unidirectional conduction characteristics can effectively prevent the one or more of the battery packs BP1 to BPn from charging the other battery packs among the e battery packs BP1 to BPn. For example, this can prevent the battery pack BPn from having a relatively higher rated voltage from charging the battery pack BP1 having a relatively lower rated voltage, thereby avoiding damage to the battery pack BP1 having the relatively lower rated voltage, overheating, leaking, or even exploding.

Further, an output terminal of the power supply device (including the battery packs BP1 to BPn and the unidirectional conductive elements DB1 to DBn) may be connected to the power receiving circuit. A series circuit of each of the battery packs BP1 to BPn and the corresponding one of the unidirectional conductive elements DB1 to DBn is connected in parallel with the power receiving circuit. The battery packs BP1 to BPn are configured to supply electric power to the power receiving circuit. The power receiving circuit may be any type of electronic component that operates while consuming electric power.

For example, as shown in FIG. 1, the power receiving circuit may include a light-emitting diode D0 and a resistor R1. The light-emitting diode D0 and the resistor R1 are connected in series with each other. In addition, a switch SW is optionally connected in series between the light-emitting diode D0 and the resistor R1. The light-emitting diode D0 and the unidirectional conductive elements DB1 to DBn are connected in parallel with each other and disposed toward the opposite directions. A positive pin of the light-emitting diode D0 is connected in parallel to the negative pins of the unidirectional conductive elements DB1 to DBn through the switch SW and the resistor R1. A negative pin of the light-emitting diode D0 is connected in parallel to the negative terminals of the battery packs BP1 to BPn.

When the switch SW is turned on to allow the power to be supplied from the battery packs BP1~BPn of the power supply device, the currents flow to the positive pins of the unidirectional conductive elements DB1 to DBn from the positive terminals of the batteries of the battery packs BP1 to BPn, then flow to the resistor R1 from the negative pins of the unidirectional conductive elements DB1 to DBn, and then flow through the light-emitting diode D0 such that the light-emitting diode D0 emits light. In the above process, the unidirectional conductive elements DB1~DBn having the unidirectional conduction characteristics limit directions in which the currents flow, such that each of the currents cannot flow from the positive terminal of one of the battery packs BP1 to BPn to the negative terminals of the other battery packs BP1 to BPn through the positive terminals of the other battery packs BP1 to BPn. Therefore, the configuration of the unidirectional conductive elements DB1 to DBn can effectively prevent the one or more of the battery packs BP1 to BPn connected in parallel with each other from charging the other battery packs among the battery packs BP1 to BPn, the power to be supplied to the light-emitting diode D0 from the battery packs BP1 to BPn will not be affected.

It should be understood that the electric power supplied from the battery packs BP1~BPn must at least be larger than barrier voltages of the unidirectional conductive elements DB1~DBn. For example, if the unidirectional conductive elements DB1~DBn are made of silicon, the electric power supplied from the battery packs BP1~BPn must be at least larger than the barrier voltage of 0.7 volts.

In the embodiment, the battery packs BP1 to BPn have the same or different rated voltages, i.e., working voltages, from each other. Each of the battery packs BP1 to BPn is connected in series to one of the unidirectional conductive elements DB1~DBn. However, the one or more battery packs BP1~BPn that have the relatively higher rated voltages can be prevented from charging the other battery packs BP1~BPn that have the relatively lower rated voltages by the configurations of the unidirectional conductive elements DB1~DBn. Therefore, in practice, only the battery packs BP1~BPn having the relatively lower rated voltages are respectively connected in series to the unidirectional conductive elements DB1~DBn. As a result, it can prevent the battery packs BP1~BPn having the relatively lower rated voltages from receiving currents from the battery packs BP1~BPn having the relatively higher rated voltages. The battery packs BP1~BPn having the relatively higher rated voltages may not be connected in series to any unidirectional conductive element, thereby saving circuit costs.

Figure 2:
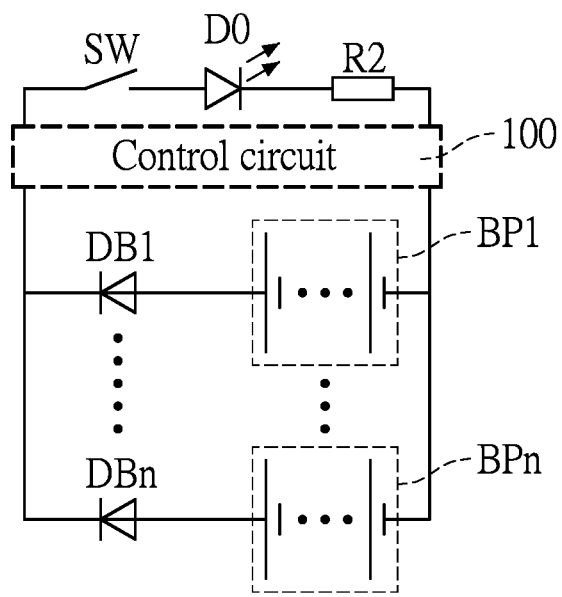
FIG. 2 is a circuit layout diagram of a power supply device according to a second embodiment of the present disclosure, where positive terminals of battery packs each having batteries are respectively connected in series to positive pins of unidirectional conductive elements, and the series circuits thus formed and a control circuit are connected in parallel with each other.

Reference is made to FIG. 2, which is a circuit layout diagram of a power supply device according to a second embodiment of the present disclosure, where positive terminals of battery packs each having batteries are respectively connected in series to positive pins of unidirectional conductive elements, and the series circuits thus formed and a control circuit are connected in parallel with each other. As shown in FIG. 2, the power supply device includes the battery packs BP1~BPn and the unidirectional conductive elements DB1~DBn. The power supply device is used for the power receiving circuit, which may include the resistor R2 and the light-emitting diode D0. The control circuit 100 is connected between the power supply device and the power receiving circuit and configured to control the power to be supplied to the power receiving circuit from the power supply device.

The positive pin of the light-emitting diode D0 of the power receiving circuit is connected in series to the switch SW, and the negative pin of the light-emitting diode D0 is connected in series to the resistor R2. The control circuit 100 may control the switch SW to be turned off, that is, in an open position as shown in FIG. 2, so that currents supplied from the battery packs BP1 to BPn cannot flow to the light-emitting diode D0. Conversely, the control circuit 100 may control the switch SW to be switched from the open position shown in FIG. 2 to a closed position, that is, from an off state to an on state, to allow the currents supplied from the battery packs BP1 to BPn to be supplied to the light-emitting diode D0 such that the light-emitting diode D0 emits light.

Additionally, another switch may be connected in series to the series circuit of each of the battery packs BP1 to BPn and the one of the corresponding unidirectional conductive elements DB1~DBn. For example, the other switch may be connected in series between each of the battery packs BP1 to BPn and the one of the corresponding unidirectional conductive elements DB1~DBn, or be connected in series to the negative pin of each of the unidirectional conductive elements DB1~DBn. The control circuit 100 may turn on the switches of the specific battery packs among the battery packs BP1 to BPn and turn off the switches of the other battery packs among battery packs BP1 to BPn based on the supplied power or other characteristics required for the light-emitting diode D0. For example, the control circuit 100 may select one or more of the battery packs BP1 to BPn for supplying appropriate power to the light-emitting diode D0 of the power receiving circuit, according to characteristics such as the voltages and the number of the battery packs BP1 to BPn, and lifetimes and the number of the batteries of each of the battery packs BP1 to BPn.

Figure 3:
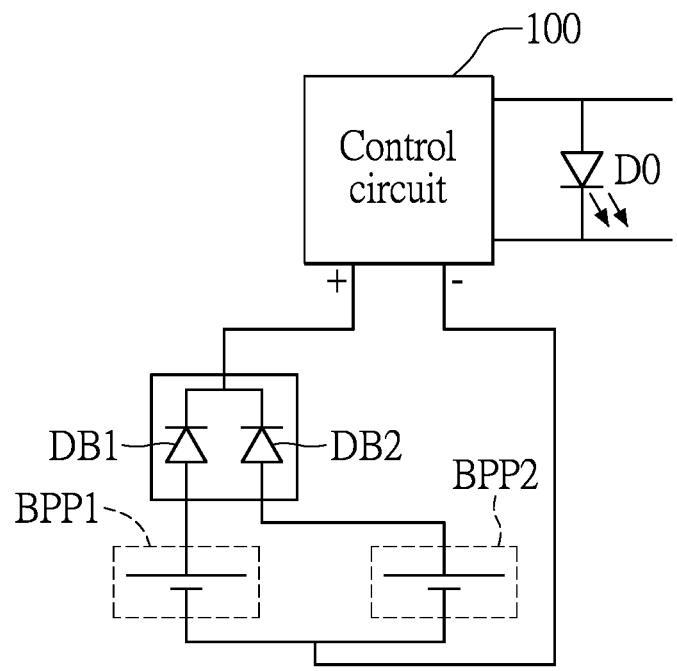
FIG. 3 is a circuit layout diagram of a power supply device according to a third embodiment of the present disclosure, where positive terminals of two battery packs each having a single battery are respectively connected in series to positive pins of unidirectional conductive elements, and the two series circuits and a control circuit are connected in parallel with each other.

Reference is made to FIG. 3, which is a circuit layout diagram of a power supply device according to a third embodiment of the present disclosure, where positive terminals of two battery packs each having a single battery are respectively connected in series to positive pins of unidirectional conductive elements, and the two series circuits and a control circuit are connected in parallel with each other. As shown in FIG. 3, the power supply device incudes the two battery packs BPP1 and BPP2 and the two unidirectional conductive elements DB1 and DB2. The power supply device is used for the power receiving circuit including the light-emitting diode D0. The control circuit 100 is connected between the power supply device and the power receiving circuit and configured to control the power to be supplied to the power receiving circuit from the power supply device.

In comparison with the battery packs BP1 to BPn each having the plurality of batteries in the first and second embodiments, each of the battery packs BPP1 and BPP2 has only one battery in the third embodiment. The batteries of the battery packs BPP1 and BPP2 are respectively connected to the unidirectional conductive elements DB1 and DB2. More specifically, a positive terminal of the battery pack BPP1 is connected in series to the positive pin of the unidirectional conductive element DB1, and a positive terminal of the battery pack BPP2 is connected in series to the positive pin of the unidirectional conductive element DB2. The series circuit of the battery pack BPP1 and the unidirectional conductive element DB1 is connected in parallel to the series circuit of the battery pack BPP2 and the unidirectional conductive element DB2.

The negative pins of the unidirectional conductive elements DB1 and DB2 are connected to the positive pin of the light-emitting diode D0 through the positive terminal of the control circuit 100. The negative terminals of the battery packs BPP1 and BPP2 are connected to the negative pin of the light-emitting diode D0 through the negative terminal of the control circuit 100. When the battery packs BPP1 and BPP2 of the power supply device respectively supply two of the same or different currents, the two currents flow to the control circuit 100 through the unidirectional conductive elements DB1 and DB2 respectively from the positive terminals of the battery packs BPP1 and BPP2.

The control circuit 100 may allow the two currents to flow through the light-emitting diode D0 asynchronously. The light-emitting diode D0 may continuously or intermittently emit light with the same or different brightness at different time points by sequentially using the currents having the same or different current values from the battery packs BPP1 and BPP2. Alternatively, the control circuit 100 may allow the two currents from the battery packs BPP1 and BPP2 to flow through the light-emitting diode D0 synchronously, such that the light-emitting diode D0 emits light having a relatively larger luminous intensity with the two currents.

Figure 4:
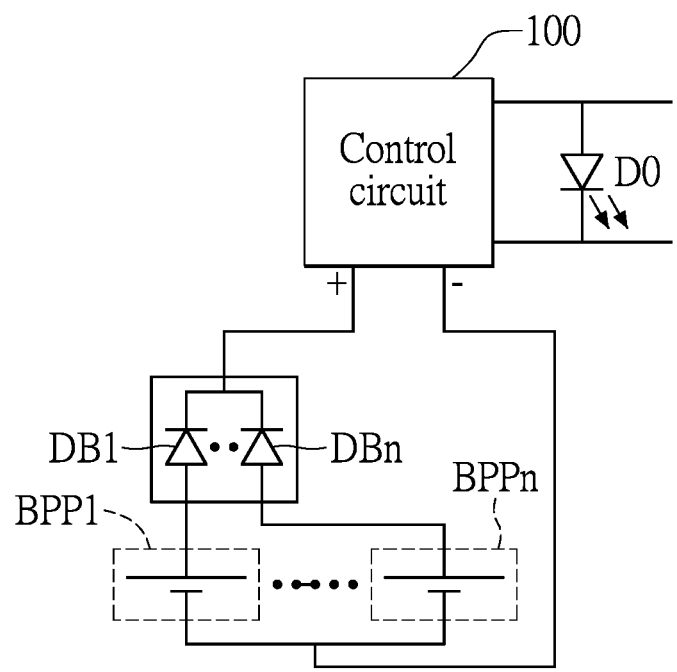
FIG. 4 is a circuit layout diagram of a power supply device according to a fourth embodiment of the present disclosure, where positive terminals of battery packs each having a single battery are respectively connected in series to positive pins of unidirectional conductive elements, and the series circuits thus formed and a control circuit are connected in parallel with each other.

Reference is made to FIG. 4, which is a circuit layout diagram of a power supply device according to a fourth embodiment of the present disclosure, where positive terminals of battery packs each having a single battery are respectively connected in series to positive pins of unidirectional conductive elements, and the series circuits thus formed and a control circuit are connected in parallel with each other. As shown in FIG. 4, the power supply device includes a plurality of battery packs BPP1~BPPn and the plurality of unidirectional conductive elements DB1~DBn, wherein n may be any positive integer larger than 1. Each of the battery packs BPP1 and BPP2 has only one battery. The batteries of the battery packs BPP1 and BPP2 are respectively connected to the unidirectional conductive elements DB1 and DB2. In comparison with the only two battery packs BPP1 and BPP2 disposed in the third embodiment, more battery packs BPP1~BPPn are configured in the fourth embodiment, wherein n may be larger than 2. In addition, the unidirectional conductive elements DB1~DBn are increased with the increase of the battery packs BPP1~BPPn. That is, the number of the unidirectional conductive elements DB1~DBn depends on the number of the battery packs BPP1~BPPn. By connecting more battery packs in parallel to each other to increase a capacitance of the power supply device, a frequency of replacing the dead or damaged battery during a process of supplying the power can be reduced, thereby prolonging the lifetime of the power supply device and improving convenience in use.

Figure 5:
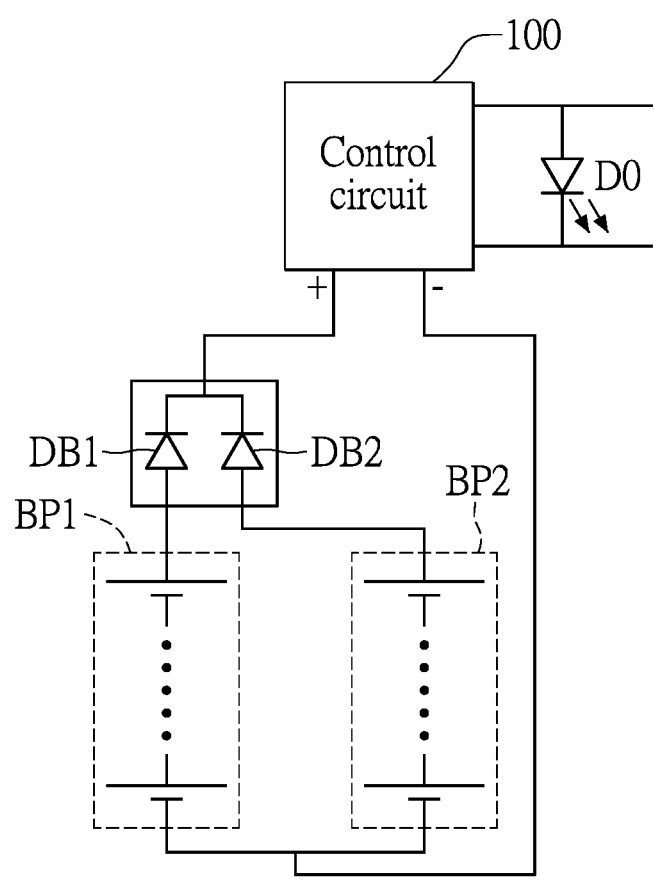
FIG. 5 is a circuit layout diagram of a power supply device according to a fifth embodiment of the present disclosure, where positive terminals of two battery packs each having batteries are respectively connected in series to positive pins of unidirectional conductive elements, and the two series circuits and a control circuit are connected in parallel with each other.

Reference is made to FIG. 5, which is a circuit layout diagram of a power supply device according to a fifth embodiment of the present disclosure, where positive terminals of two battery packs each having batteries are respectively connected in series to positive pins of unidirectional conductive elements, and the two series circuits and a control circuit are connected in parallel with each other. As shown in FIG. 5, the power supply device includes the two battery packs BP1 and BP2 and the two unidirectional conductive elements DB1 and DB2. The battery pack BP1 is connected in series to the unidirectional conductive elements DB1 and the battery pack BP2 is connected in series to the unidirectional conductive elements DB2. The series circuit of the battery pack BP1 and the unidirectional conductive elements DB1 is connected in parallel to the series circuit of the battery pack BP2 and the unidirectional conductive elements DB2. In comparison with the battery packs BPP1 and BPP2 each having only one battery in the third embodiment as shown in FIG. 3, each of the battery packs BP1 and BP2 has a plurality of batteries connected in series to each other and disposed toward the same direction in the fifth embodiment as shown in FIG. 5.

In detail, the positive terminal of the uppermost battery among the batteries of the battery pack BP1 is connected to the positive pin of the unidirectional conductive element DB1, and connected to the positive pin of the light-emitting diode D0 through the unidirectional conductive element DB1 and the control circuit 100. The negative terminal of the lowermost battery among the batteries of the battery pack BP1 is connected to the negative pin of the light-emitting diode D0 through the control circuit 100. Similarly, the positive terminal of the uppermost battery among the batteries of the battery pack BP2 is connected to the positive pin of the unidirectional conductive element DB2, and connected to the positive pin of the light-emitting diode D0 through the unidirectional conductive element DB2 and the control circuit 100. The negative terminal of the lowermost battery among the batteries of the battery pack BP2 is connected to the negative pin of the light-emitting diode D0 through the control circuit 100.

Figure 6:
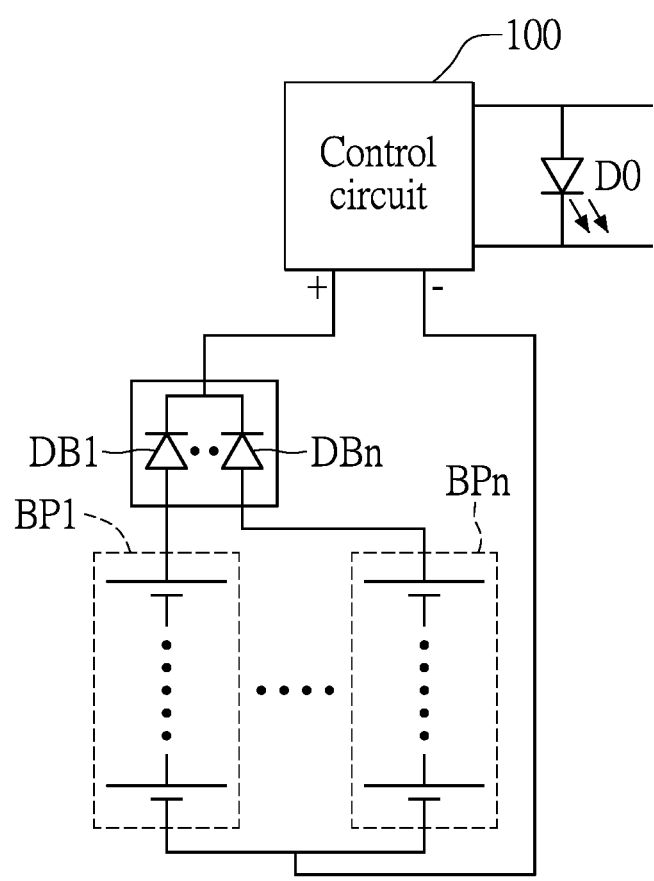
FIG. 6 is a circuit layout diagram of a power supply device according to a sixth embodiment of the present disclosure, where positive terminals of battery packs each having batteries are respectively connected in series to positive pins of unidirectional conductive elements, and the series circuits thus formed and a control circuit are connected in parallel with each other.

Reference is made to FIG. 6, which is a circuit layout diagram of a power supply device according to a sixth embodiment of the present disclosure, where positive terminals of battery packs each having batteries are respectively connected in series to positive pins of unidirectional conductive elements, and the series circuits thus formed and a control circuit are connected in parallel with each other. As shown in FIG. 6, the power supply device includes the battery packs BP1~BPn and the unidirectional conductive elements DB1~DBn. Each of the battery packs BP1~BPn has the plurality of batteries. The battery packs BP1~BPn may have the same or different numbers of batteries with each other. In comparison with only the two batteries BP1 and BP2 disposed in the fifth embodiment, that is, n=2, the power supply device includes more batteries BP1~BPn in the sixth embodiment, where n may be any positive integer larger than 2, thereby increasing a capacitance of the power supply device.

Figure 7:
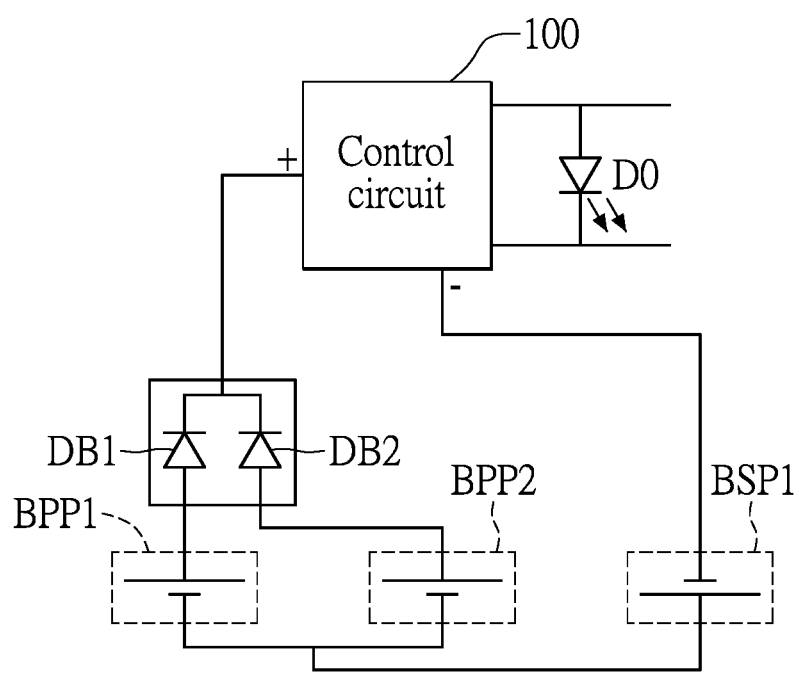
FIG. 7 is a circuit layout diagram of a power supply device according to a seventh embodiment of the present disclosure, where positive terminals of two battery packs each having a single battery are respectively connected in series to positive pins of unidirectional conductive elements, the series circuits thus formed are connected in parallel with each other, and the parallel circuits thus formed are connected in series to other battery packs each having a single battery and a control circuit.

Reference is made to FIG. 7, which is a circuit layout diagram of a power supply device according to a seventh embodiment of the present disclosure, where positive terminals of two battery packs each having a single battery are connected in series to positive pins of unidirectional conductive elements respectively, the series circuits thus formed are connected in parallel with each other, and the parallel circuits are connected in series to other battery packs each having a single battery and a control circuit. As shown in FIG. 7, the present disclosure includes the battery packs BPP1, BPP2 and BSP1 and the two unidirectional conductive elements DB1 and DB2. The power supply device is used for the power receiving circuit, which may include the light-emitting diode D0. The control circuit 100 is connected between the power supply device and the power receiving circuit.

The positive terminal of the battery pack BPP1 is connected in series to the positive pin of the unidirectional conductive element DB1. The positive terminal of the battery pack BPP2 is connected in series to the positive pin of the unidirectional conductive element DB2. The negative terminals of the unidirectional conduction elements DB1 and DB2 are connected in parallel to an input terminal of the control circuit 100, and connected to the positive pin of the light-emitting diode D0 through an output terminal of the control circuit 100. It is worth noting that the series circuit of the battery pack BPP1 and the unidirectional conductive element DB1 is connected in parallel to the series circuit of the battery pack BPP2 and the unidirectional conductive element DB2, and the parallel circuit is connected in series to the other battery pack BSP1. The positive terminal of the battery pack BSP1 is connected to the negative terminals of the two battery packs BPP1 and BPP2, and the negative terminal of the battery pack BSP1 is connected to the negative pin of the light-emitting diode D0 through the control circuit 100.

When the control circuit 100 intends to drive the power receiving circuit, for example, to drive the light-emitting diode D0 to emit light, the control circuit 100 may selectively control the battery packs BPP1 and BPP2 connected in parallel to each other and the battery pack BSP1 connected in series to the parallel circuit of the battery packs BPP1 and BPP2 to supply power. The current supplied from the battery pack BSP1 may flow through the battery pack BPP1 and the unidirectional conductive DB1 from the positive terminal of the battery pack BSP1, and the control circuit 100 then supplies the current to the light-emitting diode D0. Alternatively, the current supplied from the battery pack BSP1 may flow through the battery pack BPP2 and the unidirectional conductive DB2 from the positive terminal of the battery pack BSP1, and then the control circuit 100 supplies the current to the light-emitting diode D0. Alternatively, the current supplied by the battery pack BSP1 are divided into two shunt currents, wherein the first shunt current flows through the series circuit of the battery pack BPP1 and the unidirectional conductive DB1, and the second shunt current flows through the series circuit of the battery pack BPP2 and the unidirectional conductive DB2, and finally the control circuit 100 supplies the two shunt currents to the light-emitting diode D0. When the battery pack BSP1 supplies the current, the control circuit 100 may allow the currents from the battery packs BPP1 and BPP2 to be supplied to the light-emitting diode D0, such that the light-emitting diode D0 may receive a larger current at the same time point so as to emit light having a larger luminous intensity.

Figure 8:
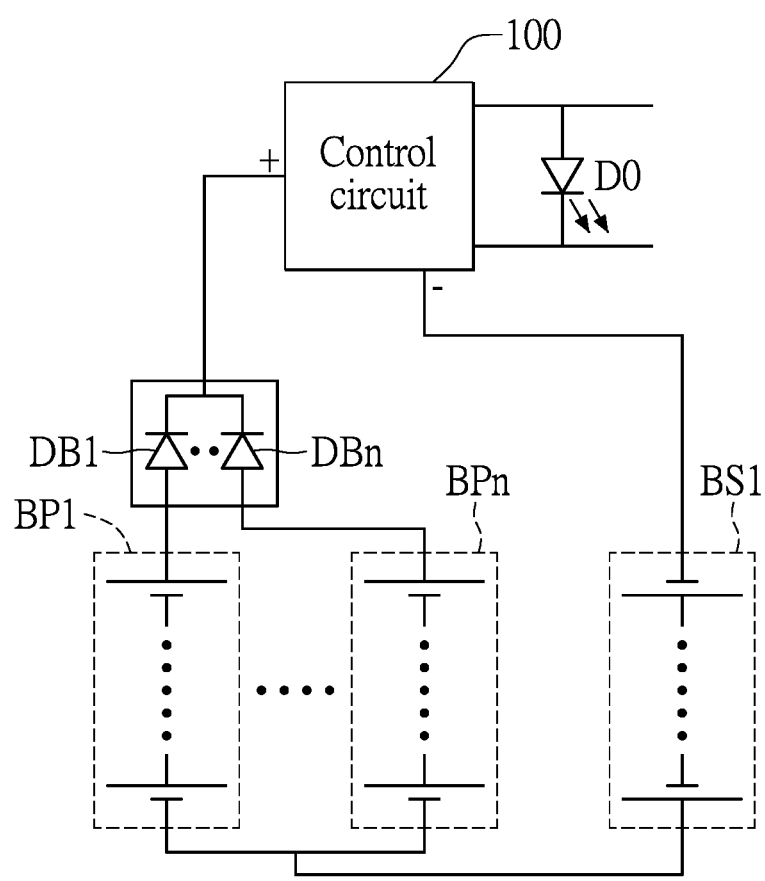
FIG. 8 is a circuit layout diagram of a power supply device according to an eighth embodiment of the present disclosure, where positive terminals of battery packs each having batteries are respectively connected in series to positive pins of unidirectional conductive elements, the series circuits thus formed are connected in parallel with each other, and the parallel circuits thus formed are connected in series to other battery packs each having batteries and a control circuit.

Reference is made to FIG. 8, which is a circuit layout diagram of a power supply device according to an eighth embodiment of the present disclosure, where positive terminals of battery packs each having batteries are respectively connected in series to positive pins of unidirectional conductive elements, the series circuits thus formed are connected in parallel with each other, and the parallel circuits thus formed are connected in series to other battery packs each having batteries and a control circuit.

As shown in FIG. 8, the power supply device includes the plurality of battery packs BP1~BPn and BS1 and the unidirectional conductive elements DB1~DBn, wherein n may be any positive integer. The number of the unidirectional conductive elements DB1~DBn depends on the number of the battery packs BP1 to BPn. The battery packs BP1~BPn are respectively connected in series to the unidirectional conductive elements DB1~DBn, and the series circuits are connected in parallel to each other. In comparison with the battery packs BPP1, BPP2 and BSP1 each having only one battery in the seventh embodiment, each of the battery packs BP1, BP2 and BS1 may have a plurality of batteries connected in series to each other and disposed toward the same direction.

As described above, in the embodiment, only the battery packs BP1~BPn connected in parallel with each other are respectively connected to the unidirectional conductive elements DB1~DBn, but the battery pack BS1 connected in series to the parallel circuit of the battery packs BP1~BPn is not connected to any unidirectional conductive element. However, it should be understood that, in practice, if more battery packs (BS2~BSn, which are not shown in FIG. 8) are connected in parallel to the battery pack BS1, all of the battery packs (BS1~BSn) or some of the battery packs (BS1~BSn) that have relatively lower rated voltages may be respectively connected in series to the unidirectional conductive elements. Each of the battery packs (BS1~BSn) may have a plurality of batteries connected in series with each other.

Alternatively, the battery packs BP1~BPn and the other battery packs (BS1~BSn) may have the same or different rated voltages. The one or more battery packs BP1~BPn and/or one or more battery packs (BS1~BSn) that have the relatively lower rated voltages are respectively connected in series to the unidirectional conductive elements. In other words, the one or more battery packs BP1~BPn and/or one or more battery packs (BS1~BSn) that have the same highest rated voltage do not need to be connected in series to any unidirectional conductive element, thereby saving circuit costs.

Figure 9:
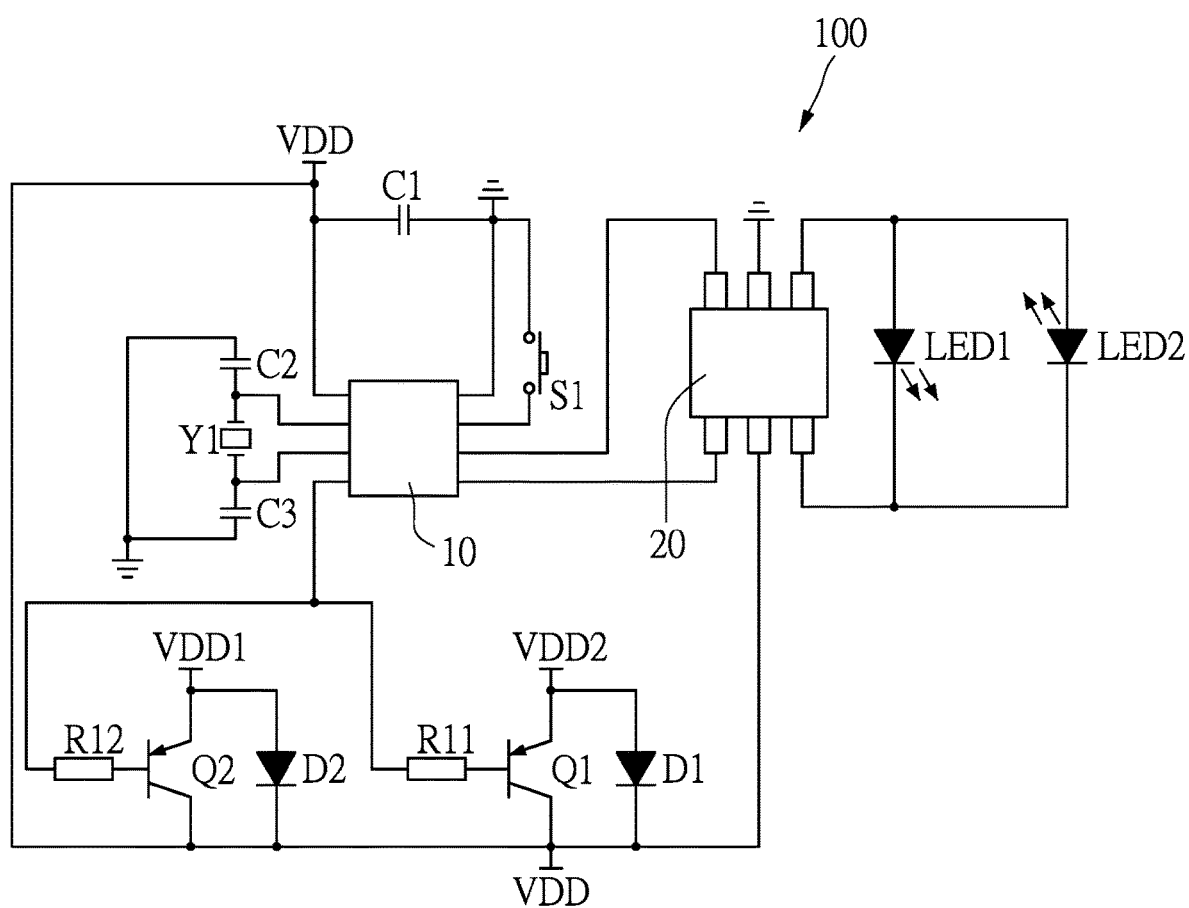
FIG. 9 is a circuit layout diagram of a control circuit of a power supply device according to an embodiment of the present disclosure.

Reference is made to FIG. 9, which is a circuit layout diagram of a control circuit of a power supply device according to an embodiment of the present disclosure.

As shown in FIG. 9, the control circuit 100 may include a first integrated circuit 10, a second integrated circuit 20, a resonant circuit and a plurality of switch circuits. For example, the first integrated circuit 10 may be a SOP8 integrated circuit chip as a controller, and the second integrated circuit 20 may a XJX-M005 integrated circuit chip as a driver.

A first pin of the first integrated circuit 10 may be connected to a voltage source VDD. A second pin and a third pin of the first integrated circuit 10 may be connected to the resonant circuit. In detail, the resonant circuit includes a quartz oscillator Y1 and capacitors C2 and C3. The second pin of the first integrated circuit 10 is connected between one terminal of the quartz oscillator Y1 and one terminal of the capacitor C2 of the resonant circuit. The third pin of the first integrated circuit 10 is connected between another terminal of the quartz oscillator Y1 and another terminal of the capacitor C3 of the resonant circuit. Another terminal of the capacitor C2 and another terminal of the capacitor C3 are grounded.

A fourth pin of the first integrated circuit 10 may be connected to a plurality of switching circuits. The switching circuit includes a transistor Q2, a resistor R12, and a light-emitting diode D2. In the embodiment, the transistor Q2 is a PMOS transistor, but it may be replaced with other switching elements in practice, and the configuration relationship of the transistor Q2 with other components may be adjusted accordingly. Both terminals of the resistor R12 may be respectively connected to the fourth pin of the first integrated circuit 10 and a gate terminal of the transistor Q2. A source terminal of the transistor Q2 is connected to a voltage source VDD1, and a drain terminal of the transistor Q2 is connected to the voltage source VDD. A positive terminal of the light-emitting diode D2 is connected to the source terminal of the transistor Q2, and a negative terminal of the light-emitting diode D2 is connected to the voltage source VDD.

Similarly, another switching circuit includes a transistor Q1, a resistor R11, and a light-emitting diode D1. In the embodiment, the transistor Q1 is also a PMOS transistor, but the present disclosure is not limited thereto. Both terminals of the resistor R11 are respectively connected to the fourth pin of the first integrated circuit 10 and a gate terminal of the transistor Q1. A source terminal of the transistor Q1 is connected to a voltage source VDD2, and a drain terminal of the transistor Q1 is connected to the voltage source VDD. The positive terminal of the light-emitting diode D1 is connected to the source terminal of the transistor Q1, and the negative terminal of the light-emitting diode D2 is connected to the voltage source VDD.

Further, the capacitor C1 may be connected across the first pin and an eighth pin of the first integrated circuit 10. The eighth pin of the first integrated circuit 10 may be grounded. One terminal of the switch S1 may be connected to a seventh pin of the first integrated circuit 10 and the other terminal of the switch S1 is grounded. A sixth pin of the first integrated circuit 10 may be connected to a third pin of the second integrated circuit 20. A fifth pin of the first integrated circuit 10 may be connected to a fourth pin of the second integrated circuit 20. A fifth pin of the second integrated circuit 20 may be connected to the voltage source VDD, and a second pin of the second integrated circuit 20 is grounded. A first pin of the second integrated circuit 20 may be connected to positive pins of the light-emitting elements LED1 and LED2. A sixth pin of the second integrated circuit 20 may be connected to negative pins of the LEDs LED1 and LED2.

Figure 10:
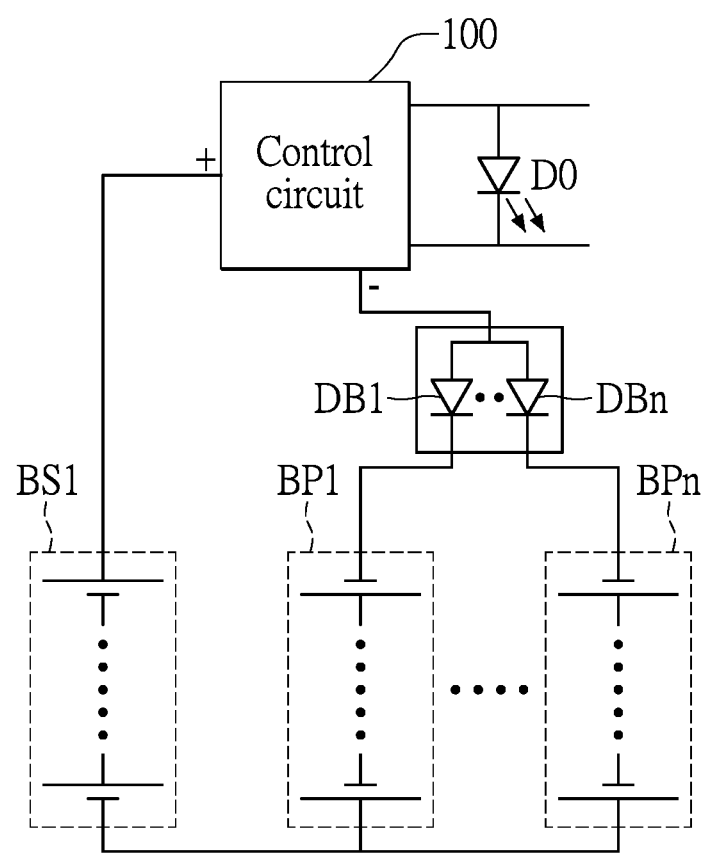
FIG. 10 is a circuit layout diagram of a power supply device according to a ninth embodiment of the present disclosure, where negative terminals of battery packs each having batteries are respectively connected in series to negative pins of unidirectional conductive elements, the series circuits thus formed are connected in parallel with each other, and the parallel circuits thus formed are connected in series to other battery packs each having batteries and a control circuit.

Reference is made to FIG. 10, which is a circuit layout diagram of a power supply device according to a ninth embodiment of the present disclosure, where negative terminals of battery packs each having batteries are respectively connected in series to negative pins of unidirectional conductive elements, the series circuits thus formed are connected in parallel with each other, and the parallel circuits thus formed are connected in series to other battery packs each having batteries and a control circuit.

As shown in FIG. 10, the power supply device includes the plurality of battery packs BP1 to BPn and BS1, and the plurality of unidirectional conductive elements DB1 to DBn. The battery packs BP1 to BPn are respectively connected in series to the unidirectional conductive elements DB1 to DBn, the series circuits are connected in parallel with each other, and the parallel circuit is connected in series to the battery pack BS1.

It should be noted that a difference between the ninth embodiment and the eighth embodiment is that, the positive terminals of the battery packs BP1 to BPn are respectively connected to the positive pins of the unidirectional conductive elements DB1 to DBn as shown in FIG. 8, but the negative terminals of the battery packs BP1 to BPn are respectively connected to the negative pins of the unidirectional conductive elements DB1 to DBn as shown in FIG. 10. In addition, as shown in FIG. 10, the positive pins of the unidirectional conduction elements DB1 to DBn are connected to a negative input terminal of the control circuit. A positive terminal of the battery pack BS1 is connected to a positive input terminal of the control circuit 100, and a negative terminal of the battery pack BS1 is connected to the positive terminals of the battery packs BP1 to BPn. An output terminal of the control circuit is connected to the light-emitting diode D0.

Figure 11:
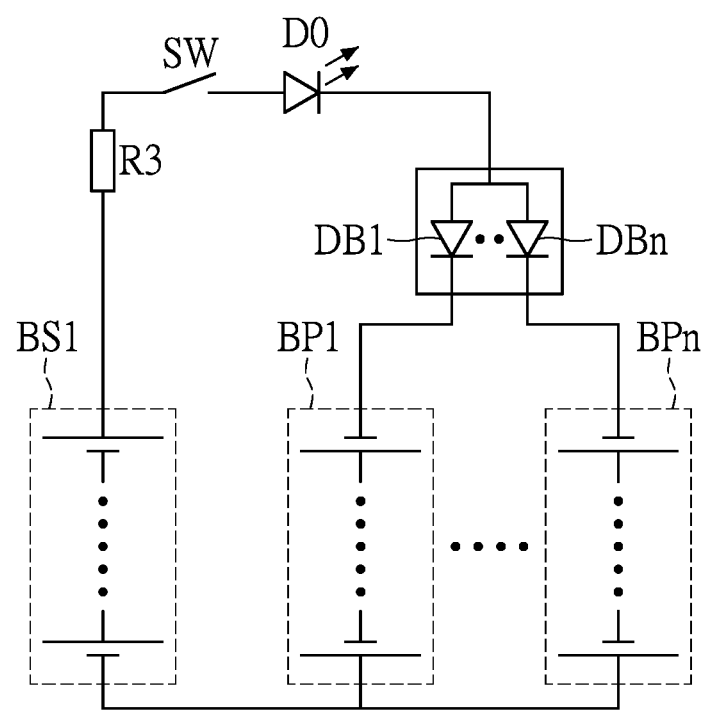
FIG. 11 is a circuit layout diagram of a power supply device according to a tenth embodiment of the present disclosure, where negative terminals of battery packs each having batteries are respectively connected in series to negative pins of unidirectional conductive elements, the series circuits thus formed are connected in parallel with each other, and the parallel circuits thus formed are connected in series to other battery packs each having batteries.

Reference is made to FIG. 11, which is a circuit layout diagram of a power supply device according to a tenth embodiment of the present disclosure, where negative terminals of battery packs each having batteries are respectively connected in series to negative pins of unidirectional conductive elements, the series circuits thus formed are connected in parallel with each other, and the parallel circuits thus formed are connected in series to other battery packs each having batteries. As shown in FIG. 11, the power supply device includes the plurality of battery packs BP1 to BPn and BS1, and the plurality of unidirectional conductive elements DB1 to DBn.

In comparison with the control circuit 100 disposed between the power supply device and the power receiving circuit such as the light-emitting diode D0 in the ninth embodiment as shown in FIG. 10, the control circuit 100 is replaced with the resistor R3, the switch SW, and the light-emitting diode D0 in the tenth embodiment as shown in FIG. 11. The resistor R3, the switch SW and the light-emitting diode D0 are connected in series to each other. The switch SW is connected between one terminal of the resistor R3 and the positive pin of the light-emitting diode D0. Another terminal of the resistor R3 is connected to the positive terminal of the battery pack BS1. The negative pin of the light-emitting diode D0 is connected to the positive pins of the unidirectional conductive elements DB1 to DBn.

Figure 12:
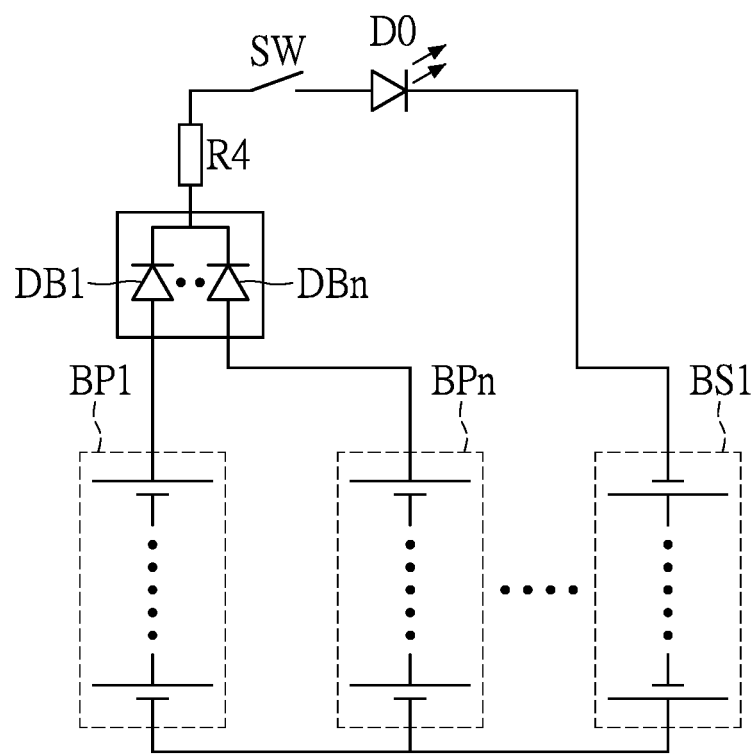
FIG. 12 is a circuit layout diagram of a power supply device according to an eleventh embodiment of the present disclosure, where positive terminals of battery packs each having batteries are respectively connected in series to positive pins of unidirectional conductive elements, the series circuits thus formed are connected in parallel with each other, and the parallel circuits thus formed are connected in series to other battery packs each having batteries.

Reference is made to FIG. 12, which is a circuit layout diagram of a power supply device according to an eleventh embodiment of the present disclosure, where positive terminals of battery packs each having batteries are respectively connected in series to positive pins of unidirectional conductive elements, the series circuits thus formed are connected in parallel with each other, and the parallel circuits thus formed are connected in series to other battery packs each having batteries.

As shown in FIG. 11, the power supply device includes the plurality of battery packs BP1 to BPn and BS1, and the plurality of unidirectional conductive elements DB1 to DBn.

In comparison with the control circuit 100 disposed between the power supply device and the power receiving circuit such as the light-emitting diode D0 in the ninth embodiment as shown in FIG. 8, the control circuit 100 is replaced with the resistor R4, the switch SW, and the light-emitting diode D0 in the eleventh embodiment as shown in FIG. 12. The resistor R4, the switch SW, and the light-emitting diode D0 are connected in series to each other. The switch SW is connected between one terminal of the resistor R4 and the positive pin of the light-emitting diode D0. Another terminal of the resistor R4 is connected to the negative pins of the unidirectional conductive elements DB1 to DBn. The negative terminal of the light-emitting diode D0 is connected to the negative terminal of the battery pack BS1.

In summary, the present disclosure provides the power supply device, wherein all of the battery packs or some of the battery packs that have the relatively lower voltages are respectively connected in series to the unidirectional conductive elements such as the light-emitting diodes that have unidirectional conductive characteristics respectively. Therefore, the present disclosure is capable of effectively preventing one or more battery packs from charging other battery packs connected in parallel to the one or more battery packs, thereby preventing the battery packs from being damaged, overheating, leaking, or even exploding.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power supply device, comprising:
a plurality of first battery packs connected in parallel with each other and disposed toward the same direction; and
a plurality of first diodes connected in parallel with each other and disposed toward the same direction, wherein negative pins of the first diodes are respectively connected in series to negative terminals of the first battery packs except for the first battery pack having a highest rated voltage among the plurality of first battery packs; and
a plurality of second battery packs having different rated voltages from each other and connected in parallel with each other, wherein a parallel circuit of the second battery packs is connected in series to a parallel circuit of the first battery packs, a positive terminal of each second battery pack is connected to the negative terminal of each first battery pack, and a negative terminal of each second battery pack is connected to a power receiving circuit.

2. The power supply device of claim 1, wherein each of the first battery packs includes one or more batteries, the batteries of the same first battery pack are connected in series to each other and disposed toward the same direction, and the batteries of each of the first battery packs and the batteries of the other first battery packs are connected in parallel with each other and disposed toward the same direction.

3. The power supply device of claim 1, wherein the power supply device is connected to the power receiving circuit, an input terminal of the power receiving circuit is connected to the negative pin of each of the first diodes and a positive terminal of each of the first battery packs, and an output terminal of the power receiving circuit is connected to the negative terminal of each of the first battery packs.

4. The power supply device of claim 3, wherein the power receiving circuit includes one or more light-emitting elements, and a positive pin of the light-emitting element is connected to the negative pin of each of the first diodes and the positive terminal of each of the first battery packs, and a negative pin of the light-emitting element is connected to the negative terminal of each of the first battery packs.

5. The power supply device of claim 3, wherein the power receiving circuit is connected to a control circuit, the control circuit is connected to the negative pin of each of the first diodes and the negative terminal of each of the first battery packs, and the control circuit is configured to control or adjust power to be supplied to the power receiving circuit from the first battery packs of the power supply device.

6. The power supply device of claim 1, further comprising a second diode, which is connected in series to the first battery pack having the highest rated voltage among all of the first battery packs.

7. The power supply device of claim 1, wherein each of the second battery packs includes one or more batteries, the batteries of the same second battery pack are connected in series to each other and disposed toward the same direction, and the batteries of each of the second battery packs and the batteries of the other second battery packs are connected in parallel to each other and disposed toward the same direction.

8. The power supply device of claim 1, wherein the power supply device and the power receiving circuit are connected to a control circuit, the control circuit is connected to the negative pin of each of the first diodes, a positive terminal of each of the first battery packs, the negative terminal of each of the second battery packs and the power receiving circuit, and the control circuit is configured to control or adjust power to be supplied to the power receiving circuit from the first battery packs and the second battery packs of the power supply device.

9. The power supply device of claim 1, further comprising a plurality of second diodes, which are respectively connected in series to the second battery packs.

10. The power supply device of claim 9, wherein a positive pin of each of the second diodes is connected in series to the positive terminal of the corresponding second battery pack.

11. The power supply device of claim 9, wherein a negative pin of each of the second diodes is connected in series to the negative terminal of the corresponding second battery pack.

* * * * *